(12) United States Patent
Kipnis et al.

(10) Patent No.: US 7,312,505 B2
(45) Date of Patent: Dec. 25, 2007

(54) SEMICONDUCTOR SUBSTRATE WITH INTERCONNECTIONS AND EMBEDDED CIRCUIT ELEMENTS

(75) Inventors: Issy Kipnis, Berkeley, CA (US); Valluri R. Rao, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 283 days.

(21) Appl. No.: 10/816,264

(22) Filed: Mar. 31, 2004

(65) Prior Publication Data

US 2005/0218509 A1    Oct. 6, 2005

(51) Int. Cl.
*H01L 29/84* (2006.01)
(52) U.S. Cl. .................. 257/415; 257/414; 257/499
(58) Field of Classification Search ............... 257/414, 257/415, 499
See application file for complete search history.

(56) References Cited

U.S. PATENT DOCUMENTS

| | | | |
|---|---|---|---|
| 4,672,421 A * | 6/1987 | Lin ............... | 257/777 |
| 5,446,309 A | 8/1995 | Adachi et al. | |
| 6,274,937 B1 | 8/2001 | Ahn et al. | |
| 6,420,197 B1 * | 7/2002 | Ishida et al. .......... | 438/22 |
| 6,529,093 B2 | 3/2003 | Ma | |
| 6,531,668 B1 | 3/2003 | Ma | |
| 6,573,822 B2 | 6/2003 | Ma et al. | |
| 6,822,535 B2 | 11/2004 | Ma et al. | |
| 6,850,133 B2 | 2/2005 | Ma | |
| 6,880,235 B2 | 4/2005 | Ma | |
| 6,933,808 B2 | 8/2005 | Ma et al. | |
| 6,934,448 B2 * | 8/2005 | Akashi et al. .......... | 385/49 |
| 6,972,650 B2 | 12/2005 | Ma | |
| 6,998,691 B2 * | 2/2006 | Baugh et al. ......... | 257/433 |
| 2003/0020094 A1 * | 1/2003 | Shrauger ............. | 257/200 |
| 2003/0045044 A1 | 3/2003 | Dentry et al. | |
| 2005/0030128 A1 | 2/2005 | Ma et al. | |
| 2005/0063431 A1 | 3/2005 | Gallup et al. | |
| 2005/0122001 A1 | 6/2005 | Ma et al. | |
| 2005/0134413 A1 | 6/2005 | Bar et al. | |
| 2005/0140468 A1 | 6/2005 | Wang | |

FOREIGN PATENT DOCUMENTS

| | | |
|---|---|---|
| WO | WO 00/39853 | 7/2000 |
| WO | WO 2005/000733 A2 | 1/2005 |
| WO | WO 2005/000733 A3 | 1/2005 |

OTHER PUBLICATIONS

ELECTRONICSWEEKLY.COM. 3GSM: First Silicon GPRS Radio Front End From Phillips:, Feb. 23, 2004, 2 pages.

(Continued)

*Primary Examiner*—Evan Pert
*Assistant Examiner*—Victor A. Mandala, Jr.
(74) *Attorney, Agent, or Firm*—Blakely, Sokoloff, Taylor & Zafman LLP

(57) ABSTRACT

A semiconductor substrate integrated with interconnections and circuit components. A silicon backplane is processed with silicon processing to provide electrical connectivity for circuit elements. In one embodiment functional circuit elements, e.g., MEMS, switches, filters, are integrated on the silicon backplane. In one embodiment the function circuit elements are monolithically processed into the silicon backplane. In one embodiment the silicon backplane includes interconnections for integrated circuits on different substrates to be bonded to the silicon backplane.

22 Claims, 3 Drawing Sheets

OTHER PUBLICATIONS

SEARCHNETWORKING.COM, "Balun", 3 pages.
*Dallas Semiconductor Maxim*, "Silicon Germanium (SiGe) Technology Enhances Radio Front-End Performance", Mar. 15, 2000, 7 pages.
Jong-Soo Lee, "MCM Technology for RF Tunable Band Pass Filters Implemented by Integration of GaAs FETs and Selectively Oxidized Porous Silicon (SOPS)", *IEEE 2000 Proceedings 50th Electronic Components and Technology Conference*, May 21-24, 2000, Las Vegas, NV, p. 426-431, XP-001054602.
Robert Aigner, "RF-MEMS Filters Manufactured on Silicon: Key Facts About Bulk-Acoustic-Wave Technology", *2003 Topical Meeting on Silicon Monolithic Integrated Circuits in RF Systems*, Digest of Papers (Cat. No. 03EX668), 2003, p. 157-161, XP-002356308.
Linda P.B. Katehi, "MEMS and Si Micromachined Circuits for High-Frequency Applications", *IEEE Transactions on Microwave Theory and Techniques*, vol. 50, No. 3, Mar. 2002, p. 858-866, XP-001102280.
Clark T-C Nguyen, "Communications Applications of Microelectromechanical Systems", Proceedings 1998 Sensors Expo, May 19-21, 1998, San Jose CA, p. 447-455, XP-002190275.
PCT International Search Report, PCT Application No. PCT/US2005/010134, filed Mar. 25, 2005, 13 pages.

* cited by examiner

SEMICONDUCTOR SUBSTRATE WITH INTERCONNECTIONS AND EMBEDDED CIRCUIT ELEMENTS

FIELD

Embodiments of the invention relate to silicon integrated circuits, and particularly to interconnecting integrated circuits with other circuit elements.

BACKGROUND

Many circuits currently use discrete components and/or integrated circuits (ICs) that may be produced with different types of processing and materials. Some of the different types of processing and materials may include complimentary-metal-oxide-semiconductor (CMOS), gallium-arsenide (GaAs), lithium tantalate (LiTaO$_3$), and silicon-germanium (SiGe). Traditionally many of these devices have been assembled and interconnected on ceramic or organic interconnect devices that have traces to interconnect the various ICs and/or passives. The resulting interconnected circuit is then packaged as a single component.

FIG. 1 is a known example of interconnecting various ICs with an interconnect device. Passive substrate 110 represents traditional interconnect devices, typically organic material (e.g., FR4) or ceramics. Passive substrate 110 is passive because it has no circuit functionality except to assemble and interconnect the various circuit components. All circuit functionality, such as processing, manipulating, affecting, etc., signals in the circuit is performed in the various circuit elements assembled on top of passive substrate 110. Thus, the ICs, switches, and passives shown in FIG. 1 are the functional circuit elements. The main advantage to using passive substrate 110 is that it is relatively inexpensive, generally only requiring that contact pads and interconnect traces be manufactured onto passive substrate 110. The circuit components are then bonded or soldered to passive substrate 110. Thus, various ICs of potentially many disparate processing technologies and/or procedures can all be packaged as a single component.

Examples of various circuit elements include RLC 120, which represents discrete passive components such as resistors, inductors, and capacitors, and filters created with such passive components. These components are used to passively process signals occurring in system 100. ICs of differing processing technologies and materials are also shown as CMOS 130, SiGe 140, LiTaO$_3$ 150, and switch 160.

CMOS 130 represents ICs that are made with complimentary metal (or other conductor) oxide semiconductor (e.g., silicon) processing. SiGe 140 represents ICs that are manufactured with silicon germanium processing. Because of the differences in processing of these two technologies, processing of circuits using these different technologies occurs on different substrates and interconnecting occurs on an interconnect device such as passive substrate 110. The use of different types of circuits made with the different technologies is assumed to be well understood in the art, and consequently will not be discussed herein. Note that the interconnecting of ICs 130, 140, 150, and 160 may be performed by flip-chipping the IC and bonding to bumps, or by the use of wire bonds, as shown with SiGe 140. Additionally, the various ICs shown could be bare die rather than packaged.

LiTaO$_3$ 150 represents devices processed on a lithium tantalite substrate, which is a boutique processing technology that is traditionally used with surface acoustic wave (SAW) filters. Switch 160 is shown as one traditional element that is processed using GaAs to provide fast switching, for example, switches in radio frequency (RF) devices.

Input/Outputs 170 are used in packaging system 100. Input/Outputs 170 pads or bumps use vias through passive substrate 110 to provide interconnection to the circuitry of system 100 to the packaging of system 100. The interconnection to the packaging may be through wire bonding or metal traces connecting to the packaging pins.

Despite the inexpensive interconnect provided by passive substrate 110, there may be undesired expenses in the processing of the various ICs shown in FIG. 1. For example, many ICs use boutique processing technologies such as LiTaO$_3$ or GaAs that can be significantly more costly than silicon-based processing. However, use of these processes has been necessary to achieve the desired performance. Integrating these components made with boutique processes with strictly silicon-based components has proven costly.

Another example of the expense in traditional practice is that many circuits require the use of resistors, capacitors, inductors, and passive filters. These components may be integrated directly on the IC, or they may be discrete components, such as LTCC (low temperature co-fired ceramic) devices, that require bonding to passive substrate 110. However, there are costs associated with using discrete passive components, as well as directly integrating passives on modern ICs manufactured with high precision (e.g., 90 nm) processing. The higher precision processing is used to scale ICs with active devices such as transistors, which are typically scaleable. The increased cost of manufacturing may be justified by the increases in performance of the resulting devices. However, higher precision processing does little or nothing to increase performance of components such as the passives that do not scale. Also, for devices such as voltage regulation circuits and certain sensors, non-high-end processing is also perfectly viable for producing circuit elements of acceptable performance, making the use of high-end processing for such devices wasteful. Thus, integrating these devices on ICs consisting of scaleable active device with modern processing techniques is wasteful of processing costs as well as valuable die real estate.

BRIEF DESCRIPTION OF THE DRAWINGS

The description of embodiments of the invention includes various illustrations by way of example, and not by way of limitation in the figures and accompanying drawings, in which like reference numerals refer to similar elements.

DETAILED DESCRIPTION

Methods and apparatuses are described for using a silicon backplane to integrate and interconnect electronic components (e.g., passive, switch, filter, analog transistor, power transistor, etc.) that cannot be built on highly scalable very large scale integration (VLSI) processes in a cost effective manner. With a silicon backplane device, functional circuit elements may be monolithically integrated on the interconnect device with the interconnections. In one embodiment a silicon backplane has components and interconnects embedded in the substrate with contacts to interconnect to other ICs.

In one embodiment all components integrated directly into the silicon of a silicon backplane are manufactured with monolithic processing. Monolithic is to be understood as being part of, or consistent with, the single crystalline structure of the silicon backplane. Monolithic may be understood as processing where the resulting integrated components/interconnects are part of the silicon wafer. Another way to understand monolithic is that the devices integrated with monolithic processing are embedded in the silicon substrate (in the wafer). This may be, for example, in contrast to modern VLSI CMOS processes that have many layers, such as interconnect layers on top of integrated devices. Thus, monolithic may or may not be understood as including polysilicon grown off the silicon crystal of the silicon substrate. This would generally not include devices in a silicon substrate whose processing results in a device with layers (e.g., CMOS). Monolithic is meant to include the use of conductors, such as traces and contact pads. It may also include some active devices, for example, transistors, as discussed below.

Figure 1:
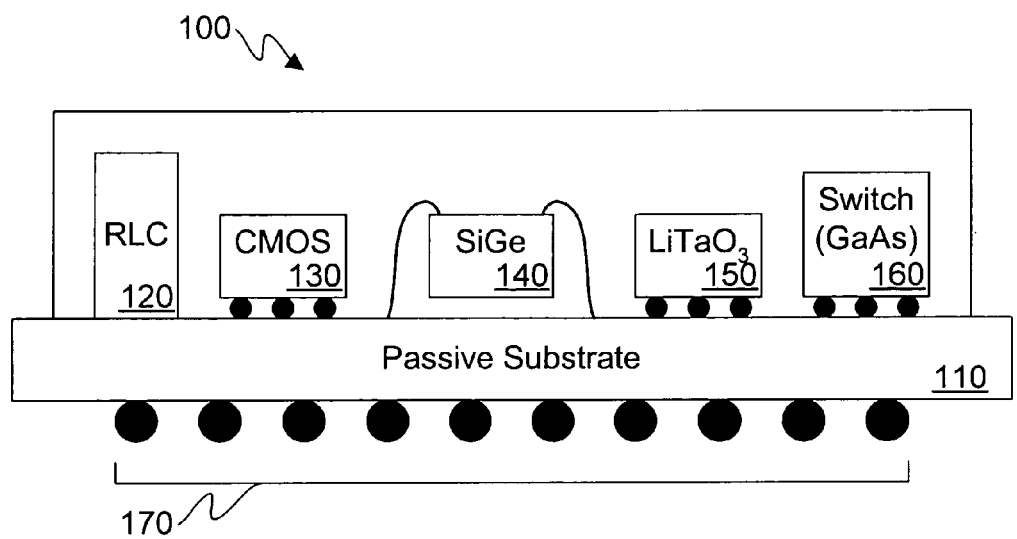
FIG. 1 is a known example of interconnecting various ICs with an interconnect device.
Figure 2:
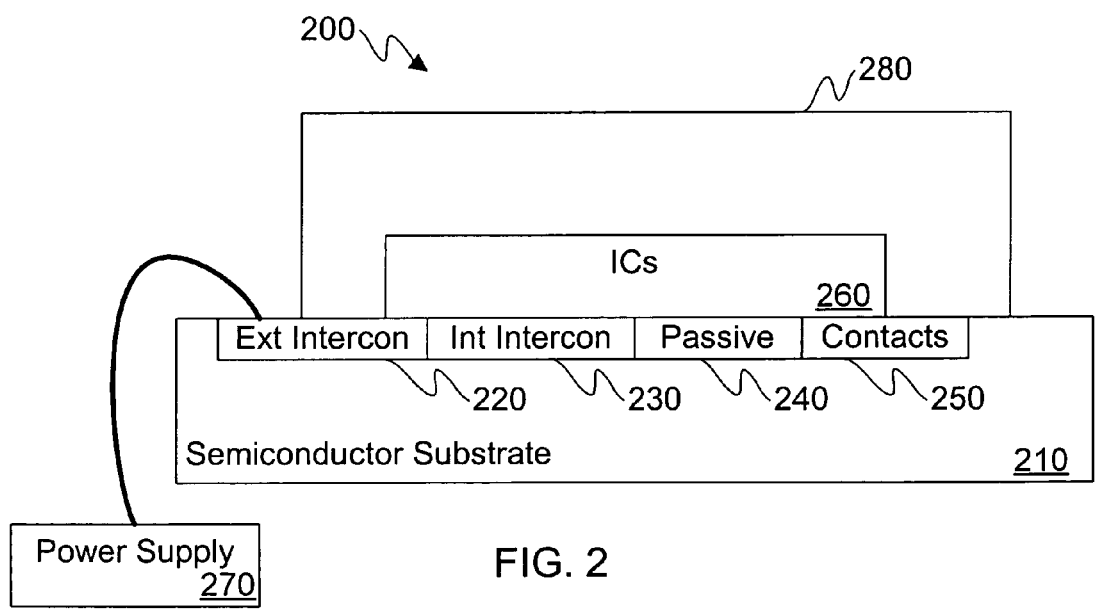
FIG. 2 is a block diagram of a silicon substrate interconnecting integrated electrical circuit components and interconnections in accordance with one embodiment of the invention.

FIG. 2 is a block diagram of a silicon substrate interconnecting integrated electrical circuit components and interconnections in accordance with one embodiment of the invention. Semiconductor substrate 210 includes a semiconductor substrate in which circuit components may be integrated or embedded, with semiconductor processing. The use of silicon as a semiconductor substrate is common. Semiconductor substrate 210 includes external interconnection 220, internal interconnection 230, passive 240, and contacts 250.

External interconnection 220 includes traces, wells, etc., used by system 200 to interconnect to packaging (e.g., pins, leads), other substrates, etc. For example, system 200 may be interconnected with power supply 270 to provide power to the circuits. Power supply 270 may be from a regulated voltage source, battery (a power storage cell), etc. Power supply 270 is typically a direct current (DC) power source. Internal interconnections 230 selectively interconnect the components embedded in semiconductor substrate 210 with each other and/or with ICs 260, which represents one or more integrated circuits that may be connected (e.g., wire bonded, flip-chip bonded) to semiconductor substrate 210.

In one embodiment passive 240 represents passive component(s) monolithically embedded in semiconductor substrate 210 with the same processing used to produce interconnections 220 and/or 230. Passive 240 provides electrical functionality in the circuit of system 200. Thus, passive 240 may modify, filter, or otherwise process signals of system 200.

Contacts 250 represents contact (bonding) pads used to interconnect ICs 260 to internal interconnections 230, which in turn interconnects ICs 260 to other elements of system 200. Contacts 250 may be areas of metal and/or high conductive material used to provide an area of relatively larger size to connect, e.g., wire bonds, bumps, to the interconnection lines/traces of internal interconnections 230. In one embodiment system 200 is enclosed with an enclosing device 280. The enclosing device will be discussed in more detail below.

Figure 3:
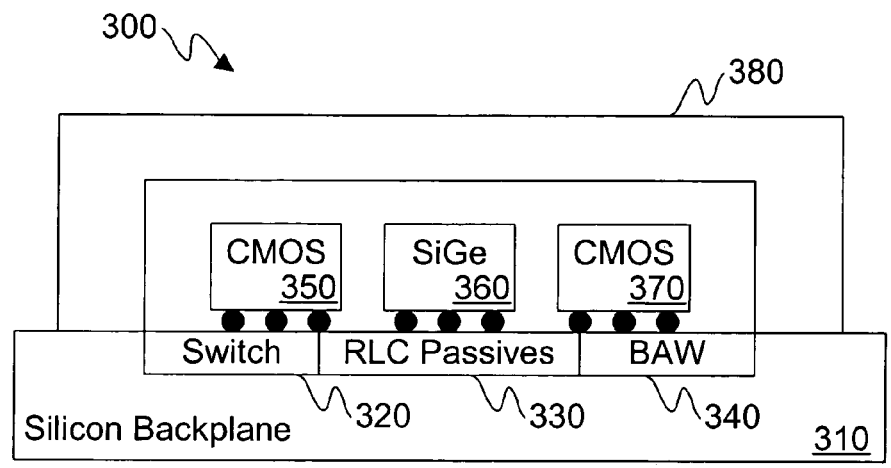
FIG. 3 is a block diagram of interconnecting ICs with a silicon backplane having components processed on the silicon backplane in accordance with one embodiment of the invention.

FIG. 3 is a block diagram of interconnecting ICs with a silicon backplane having components processed on the silicon backplane in accordance with one embodiment of the invention. Silicon backplane 310 is a piece of silicon that may be processed according to silicon processing techniques. Silicon backplane 310 is processed to interconnect various circuit elements in a single system on an IC. System 300 may include various ICs, including CMOS 350, SiGe 360, and CMOS 370. These devices represent any type of IC that may be integrated into system 300 with other ICs in the same packaging. In one embodiment the components of system 300 include silicon-based devices, thus avoiding the expense of boutique processing technologies such as $LiTaO_3$ and GaAs. However, non silicon-based IC devices may also be included in system 300 through integration onto silicon backplane 310. These devices may be electrically attached to contact pads on silicon backplane 310 by bumps or wire bonding. These devices will be selectively interconnected to each other, and to external contact pads according to the design of the system of which they are a part.

The footprint of interconnect lines or traces and contact (bonding) pads, bumps, etc. do not require high precision lithographic processing technology because they generally derive no benefit from scaling. Additionally, note that certain common circuit elements, such as passive components (e.g., resistors, capacitors) do not scale, and may not require a high precision lithographic processing technology to be produced. Thus, all such aspects of a silicon interconnect device may be integrated into the silicon interconnect with the use of non high-end (e.g., 1 μm, 0.5 μm minimum feature size) processing techniques. Note that for certain signaling requirements, traces of a larger size may in fact be desirable for an interconnect device. On such devices, the precision level of high end, state-of-the-art lithography (e.g., feature size of 90 nm, 65 nm) is not needed; a lower precision processing technology may be sufficient. Additionally, the interconnects and passives can be embedded together in a silicon substrate with many fewer processing steps that the numerous steps generally used in high end processing to produce multiple layers of circuit material (e.g., interconnects) on top of the structures actually embedded in the original substrate.

Because silicon backplane 310 includes a semiconductor substrate, in one embodiment it can be processed to have integrated devices, making silicon backplane 310 more than simply a passive interconnect device. Although it provides interconnection for system 300, silicon backplane 310 is also processed with components that provide electrical circuit functionality to system 300. For example, silicon backplane 310 may include switch 320, RLC passives 330, and bulk acoustic wave (BAW) filter 340. More or fewer components may be included in silicon backplane 310.

Note that as the interconnection aspects of silicon backplane 310 may be processed on silicon backplane 310 using non state-of-the-art lithographic processing, the functional elements processed on silicon backplane 310 may also be processed with such lesser-precision lithographic processing technologies. One advantage gained by using the same processing steps is the reduced cost in integrating the functional elements and interconnections with the same processing steps. Although the lithographic (x-y dimensions) technologies involved may be of lesser than state-ofthe-art, processing in the vertical direction (z dimension; e.g., thin film deposition, film thickness control) may be state-of-the-art. In one embodiment higher precision processing may be performed on part or all of the material of silicon backplane 310 to manufacture the integrated circuit elements.

Note that the cost of a silicon substrate used as an interconnect device is initially of higher cost than a corresponding organic or ceramic interconnect substrate. The materials of traditional interconnect substrates are cheaper than silicon, and the processing to produce the interconnection is more expensive in silicon, even when using lower-end lithographic precision processing techniques. However, the cost of a silicon substrate interconnect becomes justifiable when functional circuit elements may be manufactured in the silicon backplane, removing some or all of the need for discrete passive components. Cost reduction may also be achieved by having a substrate in which to process silicon-based components as replacements for some ICs produced with boutique processing. By eliminating the need to place some or all high real-estate passives on ICs manufactured with high-end processing technologies, or use discrete passive components that must be integrated onto a system, along with replacing ICs produced with expensive boutique technologies, the overall system costs may actually be lower. With these other costs reduced, the additional cost of the silicon backplane over the passive substrates is more than offset by the savings.

For example, one of the savings potentially achieved by the use of silicon backplane includes the fact that the level of lithographic precision for the embedded devices may be accomplished on equipment that may not be state-of-the-art. Thus, previous generation equipment could be used to produce circuit elements that may otherwise be less efficiently produced on high-end equipment that may be better used to produce highly scalable circuit elements. The production of a system on a single chip may be effectively accomplished by using non state-of-the-art lithographic equipment to produce silicon backplane 310 with its embedded circuit elements and interconnections, and interconnect scalable ICs produced with state-of-the-art equipment.

In one embodiment switch 320 includes a micro electromechanical (MEMS) switch processed on silicon backplane 310 using non high-end lithographic processing. Low insertion loss MEMS switching is known for switching, e.g., between channels of an RF module. RLC passives 330 include discrete elements as well as RLC passive filters for processing input signals. BAW 340 is a film bulk acoustic resonator, which is a silicon-based equivalent of a SAW filter used as an alternative to LiTaO$_3$ SAW filters. SAW filters cannot be monolithically integrated into silicon because they are made with LiTaO$_3$; therefore, these and other components built with boutique processing technologies will remain discrete components, instead of being able to be integrated on silicon backplane 310.

The use of silicon backplane 310 allows for the design of system 300 with state-of-the-art processing technologies to produce ICs that have scaleable circuit components, while allowing offloading of some circuit functions to functional circuit components integrated into silicon backplane 310 that may not have such exacting requirements for manufacturing.

Because MEMS devices are generally hermetically sealed, in an embodiment where MEMS device(s) are used, system 300 is capped with lid 380. Lid 380 may be, for example, a silicon, or silicon-based structure that can be affixed to the material of silicon backplane 310.

Figure 4:
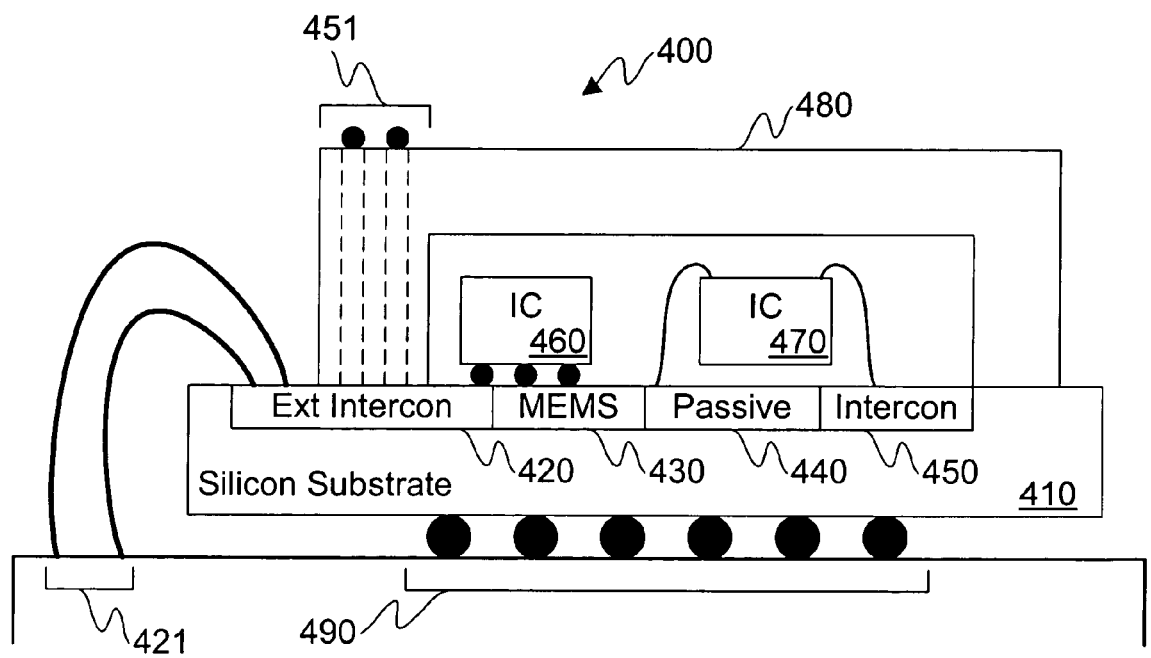
FIG. 4 is a block diagram of externally interconnecting a capped integrated circuit in accordance with one embodiment of the invention.

FIG. 4 is a block diagram of externally interconnecting a capped integrated circuit in accordance with one embodiment of the invention. System 400 is similar to that discussed above in FIG. 3. In one embodiment silicon substrate 410 includes MEMS 430 and passive 440 integrated directly on silicon substrate 410. MEMS 430 and passive 440 are merely examples of functional circuit elements that may be embedded on silicon substrate 410, and are not meant to be restrictive or exclusive of circuit elements that may be embedded in silicon substrate 410.

System 400 also includes exemplary ICs 460 and 470. IC 460 is shown bonded with bumps, and IC 470 is shown bonded with wire bonds. It is to be understood that more or fewer ICs may be included in system 400, and the various ICs may be bonded with bumps, wire bond, or other methods. Interconnections 450 represent the selective internal connections among the devices of system 400. For example, IC 460 may be interconnected to MEMS 430, while IC 470 may not be, etc. Interconnections 450 may also include traces/lines to interconnect IC 460 to IC 470. In one embodiment it will be advantageous for system 400 to have cap 480 over the circuitry.

System 400, once integrated with all of its components, is packaged as an IC in accordance with embodiments of the invention. An IC will typically have electrical connectivity points such as pins/leads on inline or quad packages, or balls on a ball-grid array (BGA) package. To connect system 400 to its packaging, system 400 is provided with external interconnection mechanism(s). Through these interconnections system 400 is able to interface with other ICs, other circuitry, power supplies, etc. In one embodiment silicon substrate 410 is processed with external interconnection 420. If system 400 includes cap 480, external interconnection 420 may extend from the internal region of system 400 that is capped to outside the cap. External interconnection 420 is then bonded to the intended packaging of system 400 via, e.g., wire bonds 421. The use of wire bonds to connect an integrated circuit to its packaging is known.

In one embodiment system 400 includes cap 480, and vias 422 drilled or etched through cap 480 to external interconnection 420. External interconnection 420 is manufactured directly on silicon substrate 410 to provide external connectivity, as with the other interconnection techniques described above. Vias 422 may be, e.g., insulated and then filled or coated with metal and/or have a wire bond used to connect to interconnection 450. It is again to be understood that the interconnections described here may be used alone or in combination, and the description herein is not intended to be limiting regarding a manner to interconnect system 400 to an external connection point.

In one embodiment system 400 is manufactured with silicon vias 490 through silicon substrate 410 to contact pads for the external interconnections. Vias 490 are typically drilled or etched through substrate 410, insulated, and filled or coated with metal to provide electrical connectivity between the contact pads and, for example, conductive traces to the pins, pads, or balls of the packaging.

Figure 5:
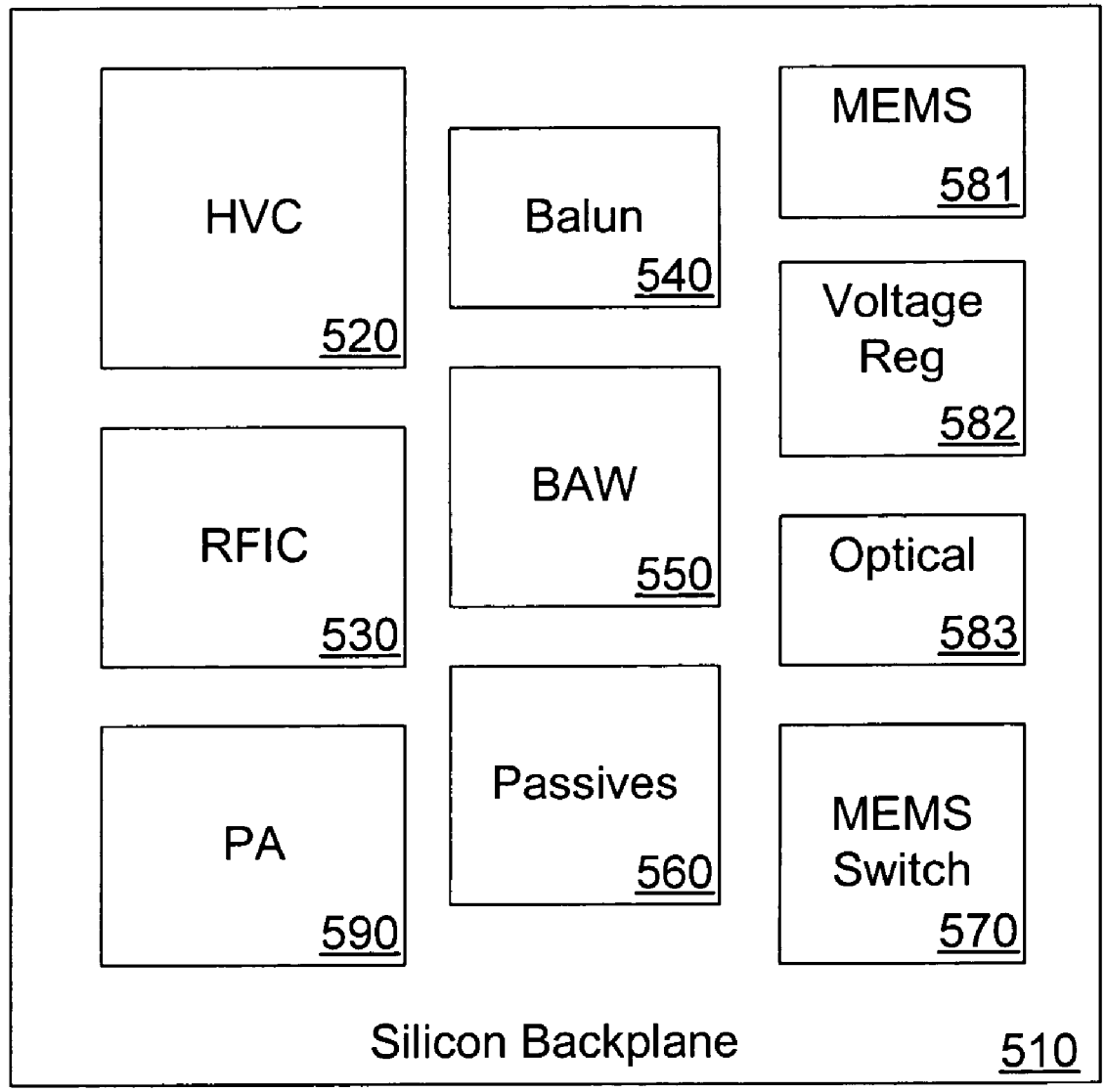
FIG. 5 is a block diagram of circuit elements on a silicon interconnect backplane in accordance with one embodiment of the invention.

FIG. 5 is a block diagram of circuit elements on a silicon interconnect backplane in accordance with one embodiment of the invention. The elements of FIG. 5 are not intended to be shown to scale. In one embodiment the elements on silicon backplane 510 are part of a highly integrated radio module. Silicon backplane 510 includes high voltage chip (HVC) 520 and radio frequency IC (RFIC) 530. HVC 520 represents an integrated circuit (whether separate IC(s) or embedded in silicon backplane 510) that provides the high voltage necessary to actuate some MEMS devices. In a radio module, RFIC 530 may refer to multiple separate components of the radio module, as with a multimode radio module.

Power amplifier (PA) 590 represents a final stage of an RF transmitter that drives an antenna attached to the circuit on silicon backplane 510, in the embodiment where silicon backplane 510 includes an RF module. PA 590 may be an IC bonded to silicon backplane 510. PAs are generally GaAs or SiGe devices and typically require passive matching and tuning networks for maximum efficiency and radiation by the antenna. These matching networks can be processed in silicon backplane 510 while one or more die encompassing PA 590 are connected to silicon backplane 510 with flip chip or wire bonding. HVC 520, RFIC 530, and PA 590 are typically integrated circuits that will be integrated together in a radio module on an interconnect device. These ICs may be integrated on silicon backplane 510 with either wire bond or flip chip bonding. These elements are meant only for purposes of illustration, and other ICs, including ICs unrelated to a radio module, may be included. In one embodiment these ICs represent any kind of IC desirable for a system on a chip design.

In one embodiment silicon backplane 510 includes several components integrated directly on silicon backplane 510 through silicon processing. For purposes of illustration, and not by way of limitation, silicon backplane 510 may include balun 540, BAW 550, passives 560, and MEMS switch 570. Balun 540 represents the many components that make up the circuitry to transform an incoming single-ended radio signal to a differential signal. Because the separate elements of balun 540 are typically components that do not scale, they can be manufactured with the lower-end processing with which silicon backplane 510 is manufactured. This provides good reason to integrate them directly onto silicon backplane 510 rather than as discrete components, or integrated on other ICs.

BAW 550 represents multiple SAW filters made of MEMS in the silicon of silicon backplane 510. In one embodiment BAW 550 is a film bulk acoustic resonator (FBAR) filter. BAW 550 represents what may be multiple discrete BAWs in the system. As with the BAW components, another component that can be processed directly into the silicon of silicon backplane 510 is passives 560. Passives 560 represents discrete resistors, capacitors, and inductors that may be present in an integrated circuit system, as well as LC filters that are typically present in radio modules. In one embodiment the silicon of silicon backplane 510 is high resistivity silicon. Thus, the passives may be manufactured of low-impedance conductor on high-resistivity silicon, which provides better performance in passives 560. The proper manufacturing of the components will result in high-Q passives 560 integrated directly into the silicon of silicon backplane 510.

As part of a radio module, or as part of another system integrated on a single die, silicon backplane 510 may include other circuit components, including, but not limited to: MEMS 581, voltage regulation 582, and optical 583. MEMS 581 is intended to represent a broad range of MEMS devices that may be integrated on an IC. For example, MEMS 481 may include: microfluidic devices with fluid channels, fluid storage (radiators), recombiners, microchannel cooler, and pumps; actuation devices used to trigger events due to force, inclining of a device in which the system is found, etc.; and electrical and/or biological sensor circuits.

Voltage regulation 582 includes regulation circuits to filter noise out of a voltage supply, or convert one voltage to another. Additionally, voltage regulation 582 may include circuits that regulate a non-steady voltage supply into a regulated voltage level.

In one embodiment silicon backplane 510 also includes optical devices 583. This includes, but is not limited to, fiber alignment channels, laser components, etc. In one embodiment silicon backplane is made of high-resistivity silicon, which looks like glass to infrared optical signals. Thus, the use of high-resistivity silicon may be advantageous when optical devices 583 are included in silicon backplane 510. In each of optical 583 and voltage regulation 482, note that these circuits may lend themselves to have active devices, such transistors, diodes, etc.

Although active devices may typically be scaleable, in various circuits, such as embodiments of the circuits mentioned here, active components may be manufactured with non high-end processing technologies because of the nature of the components needed. For example, voltage regulation will typically require larger transistors that can be adequately manufactured for the purposes they serve in their respective circuits with less precise lithography. Thus, even with what may be considered to be scaleable components may be integrated on silicon backplane 510. In one embodiment such active components may be monolithically processed with the interconnections and other circuit elements integrated on silicon backplane 510.

Reference herein to "one embodiment" or "an embodiment" means that a particular feature, structure or characteristic described in connection with the embodiment is included in at least one embodiment of the present invention. Thus, the appearance of phrases such as "in one embodiment," or "in another embodiment" describe various embodiments of the invention, and are not necessarily all referring to the same embodiment. Besides the embodiments described herein, it will be appreciated that various modifications may be made to embodiments of the invention without departing from their scope. Therefore, the illustrations and examples herein should be construed in an illustrative, and not a restrictive sense. The scope of the invention should be measured solely by reference to the claims that follow.

What is claimed is:

1. An interconnect apparatus comprising:
   a silicon substrate;
   contact pads processed on the silicon substrate to connect to an integrated circuit (IC) die;
   interconnections selectively interconnecting the contact pads, the interconnections monolithically processed on the silicon substrate; and
   circuit elements monolithically processed on the silicon substrate in the same plane as the interconnections with the same processing as the contact pads and the interconnections, the circuit elements to interoperate with the IC die, wherein the circuit elements include a micro electro-mechanical system (MEMS) device.

2. An interconnect apparatus according to claim 1, wherein the MEMS device further includes a microfluidic system.

3. An interconnect apparatus according to claim 1, wherein the MEMS device further includes an actuation circuit device.

4. An interconnect apparatus according to claim 1, wherein the circuit elements comprise a sensor circuit.

5. An interconnect apparatus according to claim 1, wherein the silicon substrate comprises a high-resistivity silicon substrate.

6. An interconnect apparatus according to claim 5, wherein the circuit elements comprise optical circuit components.

7. An interconnect apparatus according to claim 1, wherein the circuit elements comprise an active circuit element.

8. An interconnect apparatus according to claim 1, further comprising a cap processed onto the silicon substrate to hermetically isolate circuit elements on the silicon substrate.

9. An interconnect apparatus according to claim 8, wherein the cap comprises a cap of silicon-based material.

10. An interconnect apparatus according to claim 8, further comprising interconnect vias manufactured in the cap to provide electrical connectivity to contact pads on the silicon substrate.

11. An integrated circuit chip having a circuit element on a substrate created with a first lithographic processing interconnected on a silicon interconnect substrate having functional circuit elements monolithically embedded in the interconnect substrate in the same plane as interconnecting elements, created by the process of:
　processing contact pads and electrical traces monolithically on the silicon substrate with a second lithographic processing to interconnect the circuit elements;
　processing the functional circuit elements monolithically on the interconnection substrate with the second lithographic processing, to create the circuit elements in the same plane as the contact pads and electrical traces;
　processing a micro electro-mechanical system (MEMS) device monolithically on the interconnection substrate with the second lithographic processing; and
　interconnecting the circuit element of the first lithographic processing on the separate substrate to contact pads on the interconnection substrate to interconnect the circuit element of the first lithographic processing with the functional circuit elements of the second lithographic processing.

12. An integrated circuit chip according to claim 11, wherein the circuit elements comprise an active circuit element.

13. An integrated circuit chip according to claim 11, wherein the circuit elements on separate substrates comprise circuit elements all on silicon substrates.

14. An integrated circuit chip according to claim 11, wherein the silicon interconnect substrate further comprises a silicon lid to hermetically seal functional circuit elements.

15. An integrated circuit chip according to claim 14, wherein the lid further comprises interconnections through the lid to interconnection contact pads on the silicon interconnect substrate.

16. An electronic system comprising:
　a chip with an integrated circuit (IC) bonded to contact pads on a silicon interconnect backplane, the silicon backplane having integrated circuits including a micro electro-mechanical system (MEMS) device processed into the silicon backplane with the same processing used to create the contact pads, the processing different from a processing used to create the IC; and
　a direct current power storage cell coupled with the chip to supply power to the chip.

17. A system according to claim 16, wherein the MEMS device further includes a microfluidic system.

18. A system according to claim 16, wherein the MEMS device further includes an actuation circuit device.

19. A system according to claim 16, wherein the circuit elements comprise sensor circuits.

20. A system according to claim 16, further comprising a cap processed onto the silicon backplane to hermetically isolate circuit elements on the silicon backplane.

21. A system according to claim 20, wherein the cap comprises a cap of silicon-based material.

22. A system according to claim 20, further comprising interconnections manufactured through the cap to provide electrical connectivity to contact pads on the silicon backplane.

* * * * *